United States Patent
Loeffel et al.

(10) Patent No.: US 9,261,385 B2
(45) Date of Patent: Feb. 16, 2016

(54) HOUSING CAP FOR AN ELECTRONICS HOUSING, RESPECTIVELY ELECTRONICS HOUSING FROMED THEREWITH

(71) Applicant: Endress + Hauser Flowtec AG, Reinach (CH)

(72) Inventors: Philipp Loeffel, Oberwil (CH); Utz Dette, Lorrach (DE); Sascha Kamber, Aesch (CH)

(73) Assignee: ENDRESS + HAUSER FLOWTEC AG, Reinach (CH)

( * ) Notice: Subject to any disclaimer, the term of this patent is extended or adjusted under 35 U.S.C. 154(b) by 0 days.

(21) Appl. No.: 14/364,134

(22) PCT Filed: Nov. 22, 2012

(86) PCT No.: PCT/EP2012/073326
§ 371 (c)(1),
(2) Date: Oct. 1, 2014

(87) PCT Pub. No.: WO2013/087390
PCT Pub. Date: Jun. 20, 2013

(65) Prior Publication Data
US 2015/0028730 A1    Jan. 29, 2015

(30) Foreign Application Priority Data
Dec. 14, 2011   (DE) .......................... 10 2011 088 495

(51) Int. Cl.
*H05K 5/00* (2006.01)
*G01D 11/24* (2006.01)
(Continued)

(52) U.S. Cl.
CPC .................. *G01D 11/24* (2013.01); *G01D 5/00* (2013.01); *G01D 11/26* (2013.01); *H05K 7/1462* (2013.01)

(58) Field of Classification Search
CPC ........ H01B 17/40; H01B 17/38; G01F 1/662; G01F 3/12; G01F 15/14; C02F 2209/40; G01D 11/24; G01D 11/245; G01D 11/26; G01N 27/08
USPC ..................... 174/50, 188; 220/377; 361/807; 73/866.3; 312/223.1; 324/142, 306
See application file for complete search history.

(56) References Cited

U.S. PATENT DOCUMENTS 5,324,888 A    6/1994 Tyler
5,656,782 A *  8/1997 Powell et al. ................... 73/756
(Continued)

FOREIGN PATENT DOCUMENTS

DE    7149350    3/1972
DE    10126654 A1    5/2002
(Continued)

OTHER PUBLICATIONS

English translation of International Preliminary Report on Patentability, WIPO, Geneva, Jun. 26, 2014.
(Continued)

*Primary Examiner* — Hung S Bui
*Assistant Examiner* — James Wu
(74) *Attorney, Agent, or Firm* — Bacon & Thomas, PLLC

(57) ABSTRACT

A housing cap comprises: a cap basic body having a cap floor having an opening as well as a surrounding cap lateral wall adjoining an edge of the cap floor. A window pane of a transparent material placed on a side of the cap floor facing toward the cap lateral wall in a manner sealing the opening of the cap floor; as well as a contact disk placed on a side of the window pane facing away from the cap floor. The cap lateral wall includes on an inner side facing the window pane a groove, while the contact disk has a contact region bearing against the window pane as well as an outer edge having formed therein a plurality of teeth, which are in engagement with the groove.

38 Claims, 4 Drawing Sheets

(51) Int. Cl.
*G01D 11/26* (2006.01)
*H05K 7/14* (2006.01)
*G01D 5/00* (2006.01)

(56) References Cited

U.S. PATENT DOCUMENTS

| | | |
|---|---|---|
| 6,366,436 B1 | 4/2002 | Maier |
| 8,399,873 B2 | 3/2013 | Wang |
| 8,759,677 B2 | 6/2014 | Bauer |
| 2010/0261961 A1* | 10/2010 | Scott et al. ............... 600/111 |
| 2011/0317390 A1 | 12/2011 | Moser |

FOREIGN PATENT DOCUMENTS

| | | |
|---|---|---|
| DE | 102008025202 A1 | 12/2009 |
| DE | 102008042972 A1 | 4/2010 |
| DE | 202010003744 U1 | 8/2010 |
| DE | 102009030494 A1 | 5/2011 |
| DE | 102010030924 A1 | 12/2011 |
| EP | 0829004 A1 | 3/1998 |
| GB | 1402740 | 8/1975 |
| GB | 1402740 A * | 8/1975 |
| WO | 9637764 A1 | 11/1996 |
| WO | 2005062687 A1 | 7/2005 |

OTHER PUBLICATIONS

German Search Report, DPMA, Munich, Oct. 9, 2012.
International Search Report, EPO, The Netherlands, Jan. 31, 2013.

* cited by examiner

HOUSING CAP FOR AN ELECTRONICS HOUSING, RESPECTIVELY ELECTRONICS HOUSING FROMED THEREWITH

TECHNICAL FIELD

The invention relates to a housing cap for an electronics housing as well as to an electronics housing for an electronic device, especially an electronic device embodied as a measuring and/or switching device of industrial measuring and automation technology.

BACKGROUND DISCUSSION

In industrial process measurements technology, especially also in connection with the automation of chemical processes or procedures for producing a product from a raw or starting material by the use of chemical, physical or biological processes and/or the automated control of industrial plants, electronic measuring and/or switching devices installed near to too process, so called field devices are applied, which serve for producing measured values—analog or digital—representing process variables, as well as measured value signals bearing the measured values. Examples of such field devices include Coriolis mass flow measuring devices, density measuring devices, magneto inductive flow measuring devices, vortex flow measuring devices, ultrasonic flow measuring devices, thermal, mass flow measuring devices, pressure measuring devices, fill level measuring devices, temperature measuring devices, pH-value measuring devices etc. The respective process variables to be registered can include, depending on application, for example, a mass flow, a density, a viscosity, a fill level or a limit level, a pressure or a temperature or the like, of a liquid, powdered, vaporous or gaseous medium conveyed, respectively held, in a corresponding container, such as e.g. a pipeline or a tank.

For registering the respective process variables, electronic devices of the type being discussed have a corresponding physical to electrical or chemical to electrical, measuring transducer. This is most often installed in a wall of the container containing the medium or in the course of a line, for example, a pipeline, conveying the medium and serves to produce at least one electrical measurement signal corresponding to the process variable to be registered. For processing the measurement signal, the measuring transducer is further connected with an operating and evaluating circuit provided in a device electronics of the field device and serving for further processing or evaluating the at least one measurement signal, as well as also for generating corresponding measured value signals. Further examples of such measuring devices known, per se, to those skilled in the art, especially also details concerning their application and their operation, are set forth in, among others, German Patents: DE A 10 2005 025 670, DE A 10 2008 042972, DE A 101 26 654, and DE U 297 04 361[H]; USA 2004/0183550, USA 2006/0120054, US A 2006/0161359, US A 2009/0277278, U.S. Pat. No. 4,574,328, U.S. Pat. No. 4,850,213, U.S. Pat. No. 5,672,975, U.S. Pat. No. 5,706,007, U.S. Pat. No. 6,236,322, U.S. Pat. No. 6,366,436, U.S. Pat. No. 6,539,819, U.S. Pat. No. 6,556,447, U.S. Pat. No. 7,875,797; and published international applications WO A 02/103327, WO A 96/37764 and WO A 98/14763.

In the case of a large number of field devices, the measuring transducer is, for producing the measurement signal during operation, additionally so driven by a driver signal generated at least at times by the operating and evaluating circuit that it, in a manner suitable for the measurement, at least indirectly or, however, also via a probe directly contacting the medium, acts essentially directly on the medium, in order there to bring about reactions corresponding to the measured variable to be registered. The driver signal can be correspondingly controlled in such case, for example, as regards an electrical current level, a voltage level and/or a frequency. Examples of such active measuring transducers, thus measuring transducers correspondingly transducing an electrical driver signal in the medium, include, especially, the measuring transducers serving for measuring, at least at times, the flow of flowing media, e.g. measuring transducers with at least one coil producing a magnetic field driven by the driver signal, or with at least one ultrasound emitter driven by the driver signal, or, however, also fill level and/or limit level transducers serving for measuring and/or monitoring fill levels in a container, such as e.g. those with freely radiating microwave antenna, Goubau line or vibrating immersion element.

In the case of electronic devices of the type being discussed, the respective device electronics—most often embodied as a transmitter electronics, namely an electronics converting internal, proprietary, measured value signals into standardized, external, measured value signals, respectively telegrams—can usually be electrically connected via corresponding electrical lines to a superordinated electronic data processing system most often arranged spatially removed from the respective device and most often also spatially distributed, where the measured value signals correspondingly carrying the measured values produced by the respective device are forwarded near in time. Additionally, such devices during operation are usually connected with one another and/or with corresponding electronic process controllers by means of a data transmission network provided within the superordinated data processing system. The superordinated data processing system can be provided, for example, in the form of on-site, programmable logic controllers or process control computers installed in a remote control room, where the measured values, in given cases, produced by means of the device and digitized and correspondingly coded in suitable manner are forwarded. Such process control computers can further process the transmitted measured values and visualize them e.g. on monitors as corresponding measurement results and/or convert them into control signals for other field devices embodied as actuating devices, such as e.g. magnetic valves, electric motors, etc.

Since modern measuring arrangements formed by means of devices of the type being discussed are most often also directly monitored and, in given cases, controlled and/or can be configured from such control computers, in a corresponding manner, operating data intended for the respective field devices are equally transmitted via the aforementioned data transmission networks, which are most often hybrid as regards the transmission physics and/or the transmission logic.

Accordingly, the data processing system serves usually also to condition the measured value signal delivered, in given cases, by the field device, thus to condition it corresponding to the requirements of downstream data transmission networks, for example, suitably to digitize it and, in given cases, to convert it into a corresponding telegram, and/or to evaluate it on-site. For such purpose, there are provided in such data processing systems, electrically coupled using respective connecting lines, evaluating circuits, which pre- and/or further-process as well as, in case required, suitably convert, the measured values received from the respective electronic device formed, for instance, as a measuring and/or switching device. Serving for data transmission in such industrial data processing systems at least sectionally, especially serially, are fieldbusses, such as e.g. FOUNDATION FIELDBUS, RACKBUS-RS 485, PROFIBUS, etc., or, for example, also networks based on the ETHERNET standard, as well as the corresponding, most often comprehensively standardized, transmission protocols. Besides the evaluating circuits required for the processing and converting of the measured values delivered by the respectively connected field device, such superordinated data processing systems have most often also, for supplying the connected measuring and/or switching devices with electrical energy, electrical supply circuits, which provide a corresponding supply voltage, in given cases, fed directly from the connected fieldbus, for supplying power to the respective device electronics and the thereto connected electrical lines as well as driving the respective electrical currents flowing through the respective device electronics. A supply circuit can, in such case, be associated with, for example, exactly one field device and together with the evaluating circuit associated with the respective field device—for example, united into a corresponding fieldbus adapter—be accommodated in a shared electronics housing e.g. formed as a top hat rail module and/or installed in a circuitry cabinet.

In the case of devices of the type being discussed, consequently field devices of industrial measuring and automation technology, the particular device electronics is most often accommodated in a comparatively robust, for instance, impact-, pressure-, explosion- and/or weather resistant, electronics housing. This can be arranged remotely from the device and be connected with such only via a flexible line; it can, however, also, such as shown e.g. in the initially mentioned disclosures or that shown here, be arranged directly on the measuring transducer or on a measuring transducer housing separately housing the measuring transducer. Examples of such electronics housings suitable for field devices are described in, among others, the initially mentioned U.S. Pat. No. 6,366,436, German Patents DE A 101 26 654, and DE A 10 2008 042 972, U.S. Pat. No. 6,556,447 or international published application WO A 98/14763. In accordance therewith, such electronics housings comprise a most often pot-shaped housing basic body having one or more cavities. Laterally bounding the cavity is a most often sectionally circularly cylindrical, side wall having an open end and a rear wall bounding the cavity on an end oppositely lying and remote from the open end, for example, a flat or outwardly bulged, rear wall, in given cases, also a releasable, rear wall, as well as a housing cap releasably connected with the housing basic body on its open end, for example, by means of screwed connection, and serving as a closure for the basic body. The housing cap, which has most often also a viewing window integrated therein—for example, a viewing window enabling observation of a display element placed therebehind within the housing basic body—usually has a screwed connection with the housing basic body, for example, in the manner of a screw cap closure. Said viewing window is, in such case, most often formed by means of a translucent, respectively transparent material, such as, for instance, a glass, glass ceramic or plastics material, most often in the form of a window pane, which covers a window-opening provided in a most often metal or at least metallized, cap basic body. The opening is usually formed in a cap floor of the basic cap body, while the window pane is placed on a side of the cap floor facing the cavity and affixed there, and, indeed, in such a manner that the window pane closes the opening.

Industrial-strength electronic devices, consequently also their particular electronics housing and their therein respectively accommodated device electronics, must, as is known, satisfy very high protection requirements especially as regards the shielding of the therein placed electrical components against external, environmental influences, as regards protection against possible touching of voltage-carrying components and/or as regards suppression of electrical ignition sparks in the case of malfunction. For this, there exists, for example, also the requirement that an electrical current, which could flow, for example, in the case of the electronics housing being in contact with an internal voltage, via the electronics housing to ground or earth, not exceed a maximum allowable value. In the case of a connection of the electrical device to 250 V, this maximum allowable value amounts to, for example, 10 mA. If these requirements are fulfilled, then the device meets at least the requirements of protection class 11, i.e. it is an electrical device with protective insulation. For implementing these requirements, it is accordingly required that the housing of the electrical device be sufficiently insulated relative to all voltage-carrying parts of the device. Such insulation is especially necessary when the housing is composed, of electrically conductive material, for example, a metal. Moreover, electronics housings, thus the device electronics placed therein, must be sufficiently protected against penetration of moisture or impurities, especially dust, as well as contact from the outside. The degree of protection to be fulfilled on the part of the respective electronics housing, not least of all also with respect to the given application and environmental conditions, against penetration, for instance, by contact of foreign particles, respectively water, is determinable, for example, based, on the protection types defined in the German standards DIN EN 60529, respectively DIN 40 050, e.g. "dust, respectively water spray, protected from all sides (IP54)" or "dust, respectively ongoing immersion, tight (IP68)", respectively classes, or according to industrial standard NEMA 250.

Electronic devices, consequently also field devices, which also might be operated in explosion-endangered regions, must, moreover, also satisfy very high safety requirements as regards explosion protection. In such case, of concern, especially, is safely preventing the formation of sparks or at least assuring that a spark possibly occurring in the interior of a closed space has no effects on the surroundings, in order so safely to avoid the potentially possible triggering of an explosion.

As explained for this, for example, also in the initially mentioned U.S. Pat. No. 6,366,436 and U.S. Pat. No. 6,556, 447, different ignition protection types are distinguished, which are correspondingly manifested in standards relevant for electrical operating means for explosion-endangered regions, among these being the European standards EN 60079-xx, the US-American standards FM36xx, the Canadian standard C22.2, the international standard IEC 60079-18 or the standards DIN EN 50 014 ff. Thus, e.g. according to the European standard EN 60079-11:2007, explosion protection is present when electronic devices are embodied according to the therein defined ignition protection type or also the protection class with the name "Intrinsic Safety" (Ex i). In this protection class, the values for the electrical variables, electrical current, voltage and power in an electronic device must, at all times, in each case, lie below a predetermined limit value. The three limit values are so selected that, in the case of malfunction, e.g. due to a short-circuit, the maximum occurring energy is not sufficient to produce an ignition spark. The electrical current is kept, e.g. by resistances, the voltage e.g. by Zener diodes and the power by corresponding combinations of electrical current and voltage limiting components, below the predetermined limit values. European standard EN 60079-7:2007 provides another protection class with the name "Increased Safety" (Ex e). In the case of electronic devices, which are embodied according to this protection class, the ignition, respectively explosion, protection is achieved by making the spatial distances between two different electrical potentials so large that a spark formation can also not occur, due to the distance, in the case of malfunction. This can, however, in given cases, lead to the fact that circuit arrangements must have very large dimensions, in order to satisfy these requirements. Another protection class is that of European standard EN 60079-1:2007, namely ignition protection type "Pressure Resistant Encapsulation" (Ex d). Electrical devices embodied according to this protection class must have a pressure-resistant housing, in order to assure that an explosion occurring in the interior of the housing cannot be transmitted into the surrounding space.

Pressure resistant housings are embodied with comparatively thick walls, in order that they have sufficient mechanical strength. Another standard, namely EN 60079-18:2004, relates to the protection class "Potting Encapsulation" (Ex m). In such case, of concern is an ignition protection type, in which components and/or assemblies of the electronic device, which could potentially ignite an explosive atmosphere through sparks or through warming, are encapsulated in a most often elastomeric and/or foamed, embedding compound of synthetic material, in order largely to exclude contact with an explosion-endangered atmosphere and so to avoid ignition. In the USA, in Canada, in Japan and in other countries, standards comparable with the aforementioned European standards exist, for instance, FM3600, FM3610, respectively C22.2 No. 157, etc.

Furthermore, electronic devices of the type being discussed are also subject to requirements concerning electromagnetic compatibility (EMC), respectively they must satisfy corresponding testing standards.

In the case of housing caps with a therein integrated, viewing window, such forms a weak point of the total electronics housing, since a connection between window pane and cap basic body sufficiently sealed against the penetration of moisture, respectively water, can only be manufactured with comparatively great effort, for instance, by applying an adhesive between window pane and cap basic body. Said connection, as well as also the window pane, must additionally also fulfill requirements as regards impact, breaking, respectively explosion resistance, as well as also, at all times, the required sufficient blocking, respectively shielding, action against electromagnetic waves, consequently be able to exhibit the required electromagnetic compatibility.

SUMMARY OF THE INVENTION

A object of the invention is thus to provide for an electronics housing of the aforementioned type, especially a pressure, respectively explosion, resistant, electronics housing, a housing cap having a viewing window, which, on the one hand, also in the case of impact loading of the viewing window, respectively after passing a corresponding impact test, still has a sufficiently high blocking action against electromagnetic waves, and which, on the other hand, can nevertheless be produced comparatively simply, and, consequently, cost effectively.

To achieve this object, the invention resides in a housing cap for an electronics housing, which comprises: a cap basic body, for example, a pot-shaped and/or metal, cap basic body, having a cap floor having an opening as well as a surrounding cap lateral wall adjoining an edge of the cap floor; a window pane of a translucent, especially transparent, material, for example, a glass, glass ceramic or plastics material, placed on a side of the cap floor facing toward the cap lateral wall in a manner sealing the opening of the cap floor, for example, with interpositioning of a seal not covering the opening of the cap floor; as well as a contact disk placed on a side of the window pane facing away from the cap floor, for example, a metal and/or annular, contact disk, for instance, for galvanically connecting window pane and cap lateral wall. The cap lateral wall includes on an inner side facing the window pane a groove, for example, an encircling groove, while the contact disk has a contact region bearing against the window pane, for example, galvanically connected with the window pane, respectively directly contacting the window pane, as well as an outer edge having formed therein a plurality of teeth, which are in engagement with said groove.

Moreover, the invention resides, furthermore, also in an electronics housing, which comprises a housing basic body having a cavity for accommodating an electronics assembly, wherein the housing basic body has an open end; as well as a housing cap of the aforementioned type, which is concocted, especially releasably and/or in a cavity closing manner, with the housing basic body on the open end thereof.

According to a first embodiment of the housing cap of the invention, ft is provided that the contact disk is at least partially elastically deformed, especially in the region of its outer edge, relative to an original starting state.

According to a second embodiment of the housing cap of the invention, it is provided that at least some of the teeth of the contact disk are elastically deformed relative to a respective original starting state.

According to a third embodiment of the housing cap of the invention, it is provided that window pane and cap floor are adhesively connected with one another.

According to a fourth embodiment of the housing cap of the invention, it is provided that the contact disk holds the window pane pressed, especially resiliently, against the cap floor.

According to a fifth embodiment of the housing cap of the invention, it is provided that a seal is located between window pane and cap floor, especially a seal in the form of a sealing element and/or a layer of synthetic material.

According to a sixth embodiment of the housing cap of the invention, it is provided chat the window pane is metallized on its side facing away from the cap floor, at least in a region contacted, by the contact disk, especially its contact region, especially a region extending over the entire side facing away from the cap floor.

According to a first embodiment of the electronics housing of the invention, it is provided that the housing cap is connected with the housing basic body by means of screwed connection.

According to a second embodiment of the electronics housing of the invention, it is provided that the housing basic body has a side wall surrounding the cavity. Developing this embodiment of the invention further, it is, additionally, provided that an outer surface of the side wall of the housing basic body has at least one external thread, especially in an edge region adjoining the open end, and that the housing cap is embodied as a screw closure with an internal thread in engagement with the external thread; furthermore, however, also an inner surface of the side wall of the housing basic body can have an internal thread, especially in an edge region adjoining the open end and the housing cap is embodied as a screw closure with an external thread in engagement with the internal thread in the edge region.

According to a third embodiment of the electronics housing of the invention, it is provided that the cavity of the housing basic body is sealed by means of the housing cap tightly against water spray and/or explosion resistantly and/or in a manner meeting the requirements of ignition protection type "Pressure Resistant Encapsulation (Ex d)".

An advantage of the invention is that through the application of an outwardly toothed, contact disk, whose teeth formed on the outer edge are caused to engage in a very simple yet equally very effective manner in a groove formed, for example, punched, in the side wall of the housing cap, namely by forming a shape-interlocking engagement, an also impact safe, not least of all directly withstanding also impacts applied externally against the viewing window, mechanical, as well as also galvanic connection between the window pane and the housing lid, respectively its side wall, can be created. The contact disk can additionally in advantageous manner be so dimensioned as regards its spring force exerted on the window pane that it increases as a kind of safety disk supplementally the strength of the viewing window against impact externally against the window pane, for example, the adhered window pane.

In particular, there results a plurality of options, by which to embody and to develop further the devices of the invention as well as uses of the invention of such devices.

BRIEF DESCRIPTION OF THE DRAWINGS

Advantageous embodiments of the invention based on the examples of embodiments illustrated in the figures of the drawing; equal parts are provided in the figures with equal reference characters. In case helpful for perspicuity, already applied reference characters are omitted in subsequent figures. The figures of the drawing show as follows.

DETAILED DISCUSSION IN CONJUNCTION WITH THE DRAWINGS

Figure 1:
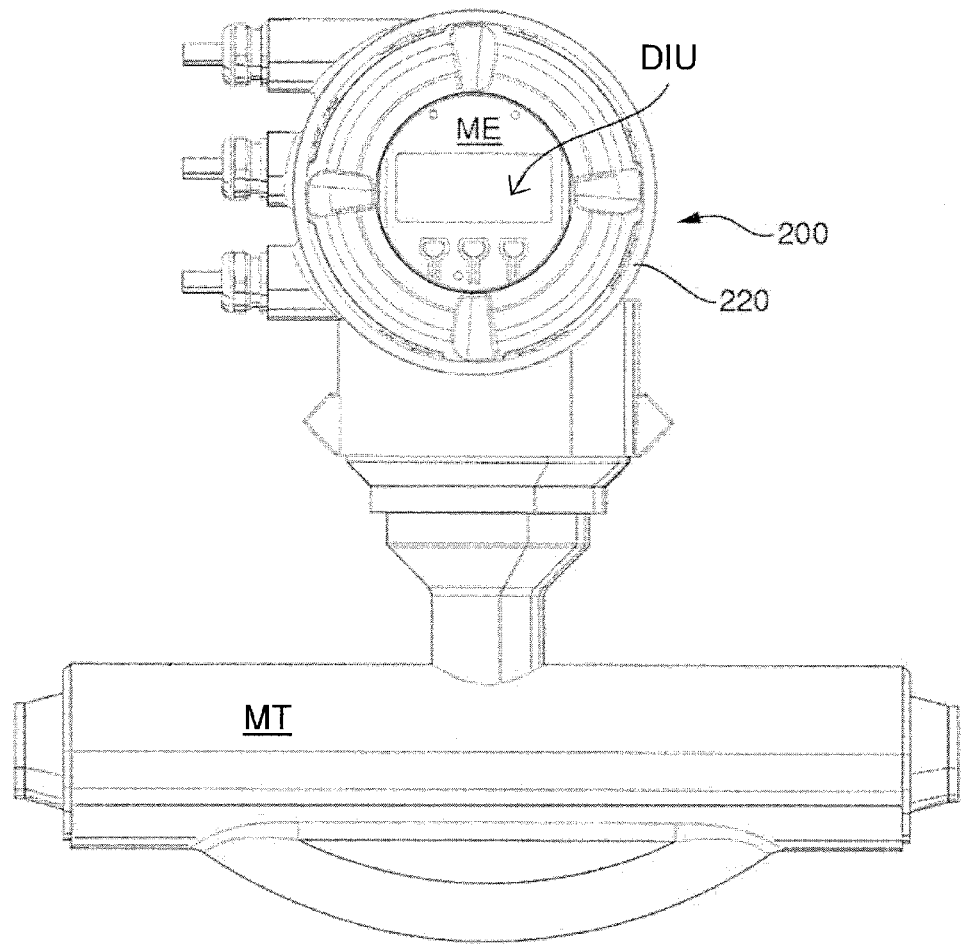
FIG. 1 is a side view of an electronic device in the form of a field device, especially a Coriolis, mass flow, measuring device, with an electronics housing.

FIG. 1 shows an electrical, electronic device, especially one embodied as a field device, namely a measuring and/or switching device of industrial measuring and automation technology.

Figure 2:
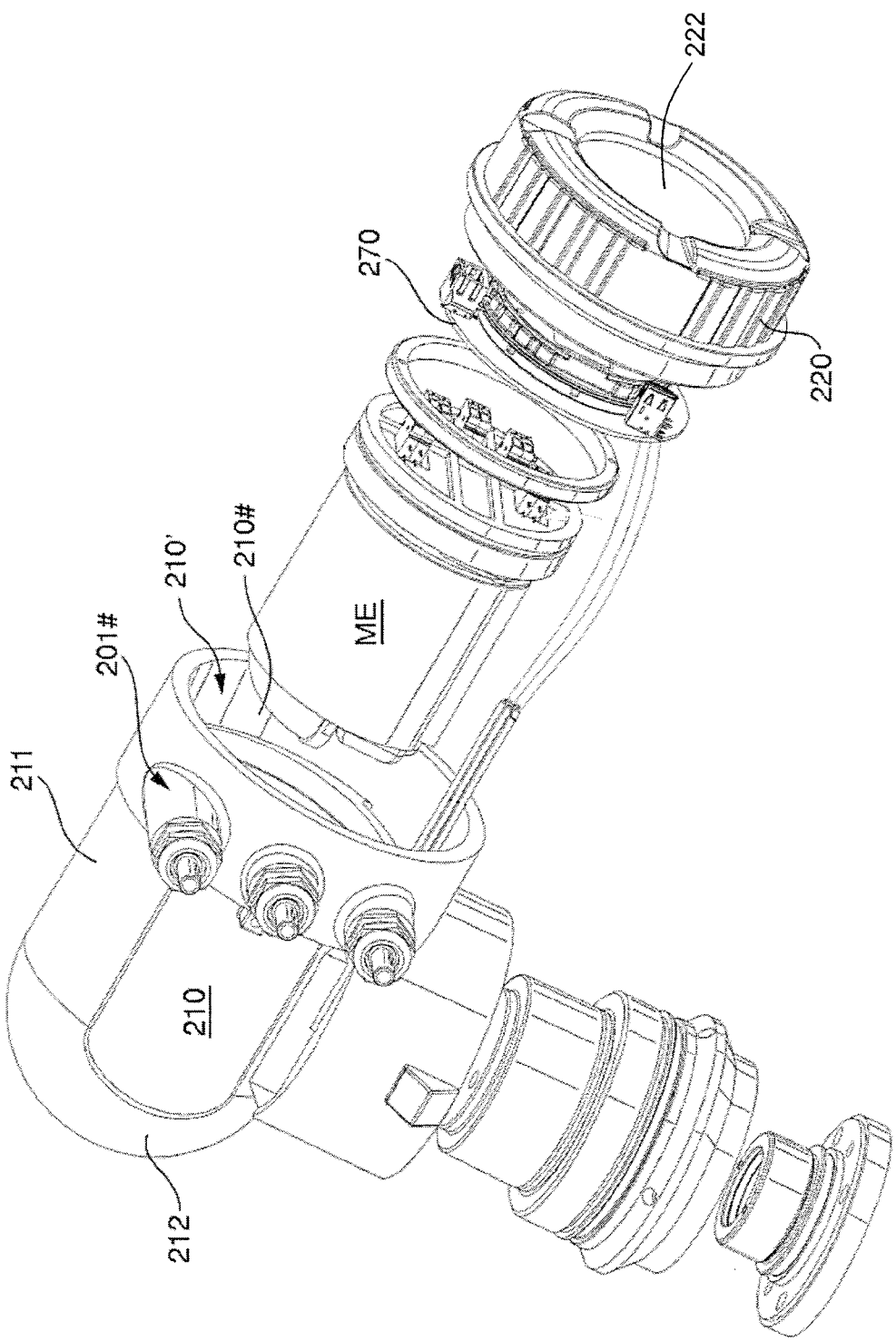
FIG. 2 shows perspectively in partially sectioned side view, an electronics housing suitable for a device of FIG. 1.

The device includes an electronics housing 200, which, as evident from a combination of FIGS. 1 and 2—is formed by means of a housing basic body 210—here an essentially pot-shaped housing basic body having a cavity 210# and an open end 210' and a housing cap 220 releasably connected with the housing basic body on its open end 210' and sealing the housing basic body, for example, water spray- and, in given cases, also dust tightly and/or explosion resistantly. The housing cap 220 includes—as evident from a combination of FIGS. 1, 2 and 3—a cap basic body 221—here likewise a pot-shaped cap basic body, especially one of metal, having a cap floor 221+ as well as a cap lateral wall 221# adjoining and surrounding an edge of the cap floor 221+, namely a lateral wall that goes all the way around.

The cavity 210# serves, among other things, to accommodate electrical, respectively electronic, components, respectively assemblies of the device formed therewith, for example, also assemblies encapsulated in electronics inserts and/or embedded in a potting compound of synthetic material, such as, for instance, polyurethane, silicone, epoxide resin or the like, as a result, assemblies connected together to form a corresponding protected device measuring electronics ME, not least of all also in order to protect such assemblies against environmental influences or contact. The housing basic body 210 includes a side wall 211 laterally bounding its cavity 210#, especially a metal and/or at least sectionally circularly cylindrical, side wall, which has an open end, and a rear wall 212 bounding the cavity on a side lying opposite to and remote from the open end, especially a flat or outwardly bulged, rear wall. The housing basic body can be, for example, monolithic, in the case of which back and side walls are connected with one another joint freely; back and side walls of the housing basic body manufactured, for example, completely of aluminum or completely of stainless steel, can, for example, however, also be connected with one another by material bonded interlocking, for instance, by means of a corresponding weld seam. Particularly in the case a monolithic housing basic body, namely one free of joints, such can be, for example, of pressure molded material, for instance, aluminum cast under pressure, or a precision cast material, for instance, stainless steel.

In operation, the electronic device is connected to an external electrical energy supply, in given cases, also an external electrical energy supply remote from the device. The connecting lines used therefor can, such as evident from the combination of FIGS. 1 and 2, be led, for example, from the respective electrical component outside of the electronics housing to be connected, thus from components of an energy supply and/or from a superordinated data processing system, via cable guides 201# provided in the edge region of the open end of the housing basic body into the cavity and electrically connected to connection terminals correspondingly placed therein, for example, connection terminals connected wish an internal supply circuit and/or with a modem of the device.

For the purpose of specially accommodating the display and interaction unit DIU, which must, in given cases, be removed, for instance, in the course of an updating and/or an on-site parametering of the device electronics and which, for example, also meets the ignition protection type "Intrinsic Safety (Ex i)", the electronics housing can further have placed in the cavity 210# a partition 270, for example, a partition also sealing the cavity 210# dust or water spray tightly, for forming a housing chamber 203 extending between a first, side of said partition facing the housing cap and an inner side of the housing cap facing the cavity of the housing basic body. The partition 270 embodied, for example, in the form of a thin metal plate, can additionally be so embodied that, after removing the housing cap from the housing basic body 210, it can itself be removed via the open end 210' of the housing basic body, for instance, for the purpose of reaching the device electronics ME situated therebehind.

Figure 3:
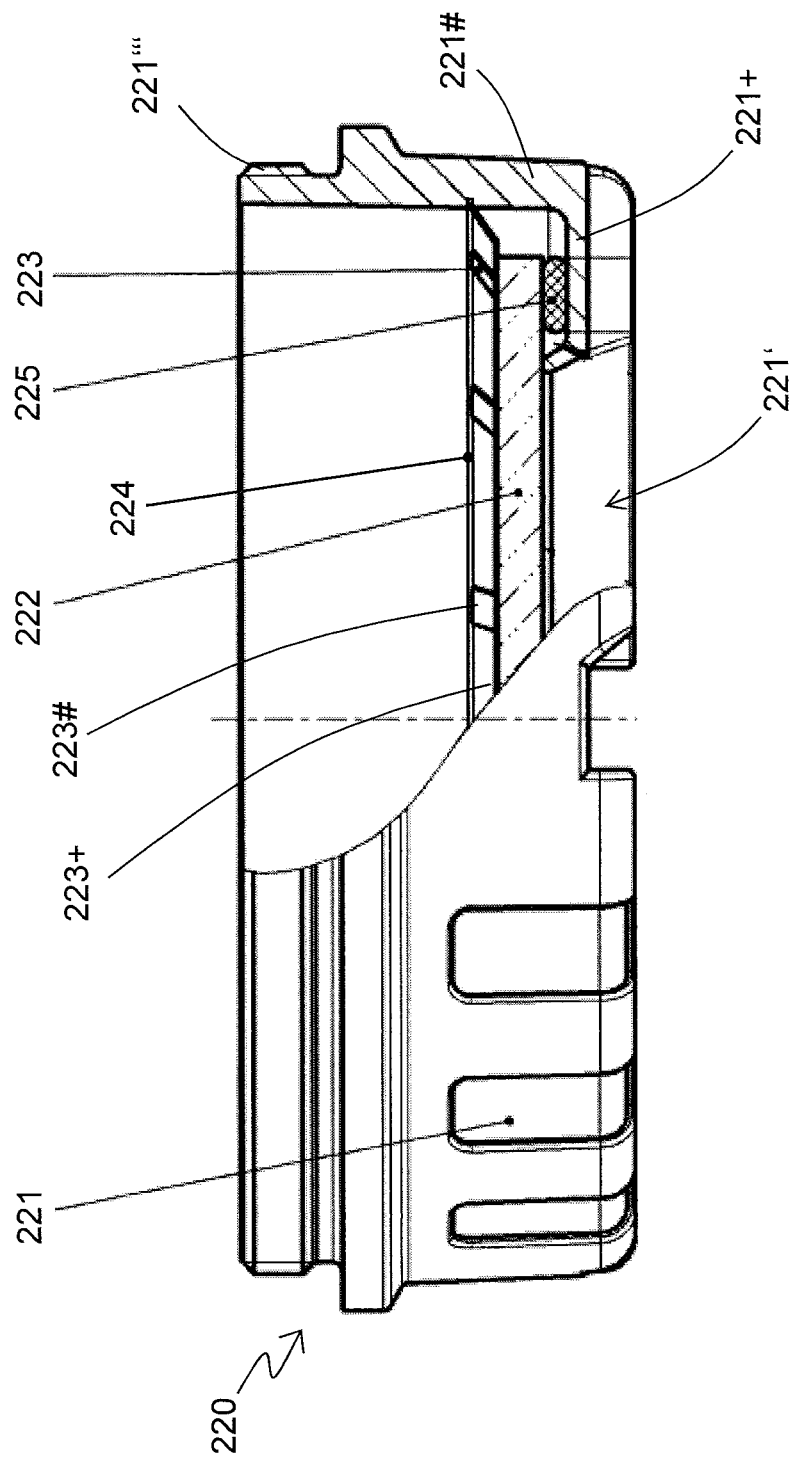
FIG. 3 shows perspectively in partially sectioned side view, a housing cap with integrated viewing window suitable for an electronics housing of FIG. 2.

The housing cap 220—here likewise having an essentially circularly shaped cross section—is, as schematically shown in FIGS. 1, 2, and 3, furthermore equipped with a viewing window and can be connected with the housing basic body 210, for example, by means of a screwed connection. In accordance therewith, the housing cap 220 can, such as quite usual in the case of electronic devices of the type being discussed, be embodied for example, as a screw closure, i.e. a screw on cap. For releasable connection of the housing cap with, the housing basic body, according to an embodiment of the invention, an outer surface of the side wall 211 or the housing basic body has, especially in a region at the edge of the open end, at least one external thread and in corresponding manner the housing cap 220 has an internal thread for engagement with said external thread. Alternatively, the inner surface the side wall 211 of the housing basic body can have in the edge region, for example, an internal thread and the housing cap 220, as schematically presented in FIG. 3, a corresponding external thread 221''', namely an external thread for engagement with the internal thread in the edge region.

In case required, housing cap 220 and housing basic body 210 can, furthermore, be so embodied, for instance, by application of sufficiently strong material are corresponding material thicknesses, and—not least of all by also providing the gap dimensions required for flame penetration blocking and explosion safety—and so connected with one another that the housing basic body 210 by means of the housing cap 220 can ultimately be sealed in a manner sufficient to meet the requirements for ignition protection type "Pressure-Resistant Encapsulation (Ex d)", respectively that the electronics housing 200 can withstand without damage an explosion pressure possibly arising therein of greater than 20 bar, especially greater than 60 bar.

The electronic device is, especially, furthermore, provided for measuring a physical and/or chemical measured variable of a medium in a pipeline extending, for example, at least sectionally through an explosion-endangered zone, and/or a medium in a container, for example, a container situated within an explosion-endangered zone. Accordingly, the electrical device can be, for example, a magneto inductive, flow measuring device, a vortex, flow measuring device, an ultrasonic, flow measuring device, a thermal, mass flow measuring device, a pressure measuring device, a fill level measuring device, a temperature measuring device, a pH-value measuring device, a conductivity measuring device or—such as presented in FIG. 1 schematically and only by way of example—a Coriolis, mass flow measuring device. The electronic device comprises, according to a further development of the invention, accordingly at least one measuring transducer MT electrically connected, especially galvanically connected, by means, for example, of a sectionally flexible, connecting line CL, with electronic components situated in an electronics housing, respectively at least one electronic assembly formed therewith. During operation, the measuring transducer provides, at least at times, at least one measurement signal corresponding to a physical and/or chemical measured variable of a medium to be measured, especially a medium guided in a pipeline and/or contained in a container, via a connecting line, for instance, for an electronic measuring and evaluating circuit formed by means of electronic components, for example, in the form of a microcomputer, situated in the electronics housing.

Serving as a measuring transducer MT can be, for example, a measuring transducer of vibration-type frequently applied in mass flow, respectively density, measuring devices having two parallel, bent, measuring tubes, which during operation are actively excited by means of an electro mechanical oscillation exciter acting thereon to execute mechanical oscillations for the purpose of producing the at least one measurement signal. For visualizing device internally produced, measured values, for example, thus mass flow measured values, density measured values, density measured values or volume flow measured values etc., and/or, in given cases, device internally generated status reports, such as, for instance, an error report for the device or an alarm concerning the medium or the process to be monitored, the device comprises on-site, according to a further development of the invention, additionally, a display and interaction unit DIU communicating at least at times with the device electronics, for instance, an LCD- or TFT-display (and/or with integrated non-volatile data memory for measuring data and/or for configuration data) situated in the electronics housing directly behind a viewing window provided in the housing cap.

For the purpose of forming the viewing window, there is provided in the cap floor 221+ of the housing basic body 221—such as evident from a combination of FIGS. 1, 2 and 3—an opening 221', which is closed by means of a window pane 222 of translucent, especially transparent, material, such as, for instance, a glass, a glass ceramic or a plastics material, situated, on a side of the cap floor 221+ facing toward the cap lateral wall 221#. For sealing the viewing window, for instance, against moisture, respectively externally striking water spray, according to an additional embodiment of the invention, there is placed between, cap floor 221+ and window pane 222 a seal 225 not covering the opening 221' of the cap floor, for example, in the form of a flat ring, an O-ring or other prefabricated, annular, in given cases, also standardized, sealing element. Seal 225 can, for example, however, also be formed by means of a layer, especially a ring-shaped layer, of synthetic material, such as, fox instance, an elastomer, which may, for example, also act adhesively to bond with the window pane and/or the cap floor. Placed on a side of the window pane 222 facing away from the cap floor 221+ is, furthermore, a contact disk 223, especially an annular contact disk, which has: a contact region 223+ bearing on the window pane 222, especially directly contacting the window pane, consequently galvanic connected with the window pane; as well as an outer edge 223' having a plurality of teeth 223# formed thereon. Also, the contact disk 223 is, in such case, of course, so formed, not least of all also as regards an inner diameter d1 so dimensioned, and so placed in the housing cap, that the opening is not blocked by said contact disk 223, consequently the view through the opening remains unobstructed. An outer diameter d2 of the contact disk 223 is, furthermore, so selected that the contact disk can be comfortably inserted into the cap basic body during assembly of the viewing window, while, however, the contact region of the contact disk 223 remains as large as possible.

The teeth 223# of the contact disk 223 contact the cap lateral wall 221# on its inner side, whereby the contact, disk is held in the housing cap basic body 221. According to an additional embodiment of the invention, it is in such case provided that the contact disk 223 is at least partially elastically deformed relative to an original starting state, not least of all also in the region of its eater edge 223'; this, especially, also in sued a manner that at least some of the teeth 223# of the contact disk 223 are elastically deformed relative to a respective original starting state.

Contact dish 223 serves in the present invention especially for galvanically connecting window pane 222 and cap lateral wall 221#, consequently for galvanically connecting window pane 222 and cap basic body 221. The window pane 222 is namely, according to an additional embodiment of the invention, not least of all also for forming a shield predominantly reflecting electromagnetic waves, metallized on the side facing away from the cap floor 211+, at least in a region contacted by the contact disk 223, which, for this, is likewise metal, respectively metallized, especially in its contact region. Said metallized region of the window pane 223, manufactured, for example, by means of physical gas phase deposition (PVD), can, in such case, also extend over the entire side of the window pane 222 facing away from the cap floor 221+. Furthermore, the contact disk 223 can, however, also serve as a spring element holding the window pane 222 pressed against the cap floor 221+, in such a manner that the contact disk 223 holds the window pane 222, in given cases, also already adhered with the cap floor 221+, resiliently, namely by application of a spring force, pressed against the cap floor 221+.

Figure 4B:
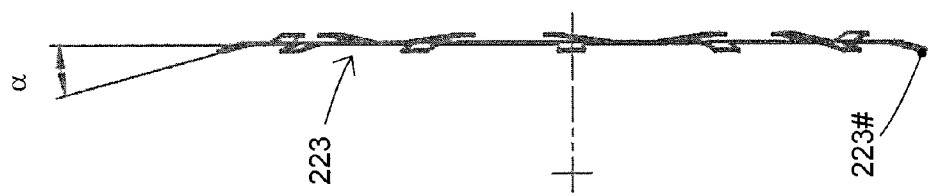
FIGS. 4a and 4b show in different side views, a contact disk suitable for the construction of a viewing window in a housing cap according to FIG. 3.
Figure 4A:
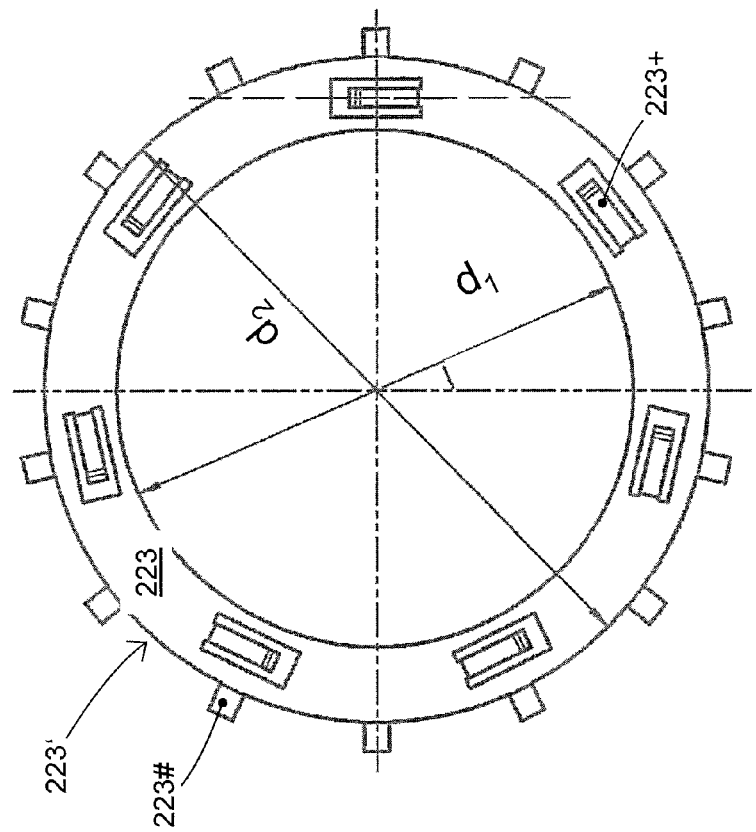

For the purpose of increasing a holding force counteracting escape of the contact disc 223 from the cap basic body 221—not least of all also for the purpose of preventing an undesired escape of the contact disk 223 from the cap basic body 221, for instance, through an impact externally on the window pane 222—the cap lateral wall 221# includes on its inner side facing the window pane 222, as schematically indicated in FIG. 3, a, for example, encircling, groove 224, with which the teeth 223# of the contact disk 223 are in engagement—forming for practical purposes a shape-interlocking engagement. For additionally increasing the aforementioned holding force, on the one hand, and for enabling a simple installation of the contact disk 223 in the cap basic body 221, on the other hand, the teeth 223# of the contact disk 223 are, according to an additional embodiment of the invention, such as directly evident from FIG. 4b, also already in the original starting state of the contact disk bent out by an angle α from an imaginary horizontal plane of the contact dish 223 essentially aligning with the contact region 233#, especially in such a manner that an imaginary envelope of the contact disk already in the original starting state of the contact disk essentially corresponds to the silhouette of a cone. As directly evident from, a combination of FIGS. 4b and 3, the teeth 223# are in the final, installed state namely likewise bent out by an angle from the imaginary horizontal plane, which, however, not least of all for the purpose of achieving the above mentioned holding force, respectively spring action, is greater than the angle α in the original starting state.

The invention claimed is:

1. A housing cap, comprising:
a cap basic body with a cap floor exhibiting an opening and with a surrounding cap lateral wall adjoining an edge of said cap floor;
a window pane of a translucent material placed on a side of said cap floor facing toward said cap lateral wall in a manner sealing said opening of said cap floor;
and a contact disk placed on a side of said window pane facing away from said cap floor;
wherein:
said cap lateral wall includes a groove on an inner side facing said window pane;
said contact disk exhibits: a contact region bearing against said window pane and an outer edge having formed thereon a plurality of teeth, which are in engagement with said groove;
said window pane is metallized on its side facing away from the cap floor, at least in a region contacted by the contact disk;
said cap basic body is a metal cap basic body;
said contact disk is a metal contact disk; and
said contact disk is adapted to galvanically connect said window pane and said cap lateral wall.

2. The housing cap as claimed in claim 1, wherein:
said contact disk is at least partially elastically deformed, in the region of its outer edge, relative to an original starting state.

3. The housing cap as claimed in claim 1, wherein:
at least some of the teeth of said contact disk are elastically deformed relative to a respective original starting state.

4. The housing cap as claimed in claim 1, wherein:
said window pane and said cap floor are adhesively connected with one another.

5. The housing cap as claimed in claim 1, further comprising:
a seal located between said window pane and said cap floor.

6. An electronics housing, comprising:
a housing basic body including a cavity for accommodating an electronics assembly, as well as
the housing cap as claimed in claim 1, wherein said housing basic body includes an open end and said housing cap is connected with said housing basic body on the open end thereof.

7. The electronics housing as claimed in claim 6, wherein:
said housing basic body includes a side wall surrounding said cavity.

8. The electronics housing as claimed in claim 6, wherein:
said cavity of said housing basic body is sealed by means of the housing cap explosion resistant.

9. The electronics housing as claimed in claim 6, wherein:
said cavity of said housing basic body is sealed by means of the housing cap tightly against water spray.

10. The housing cap as claimed in claim 1, wherein:
said contact disk holds said window pane pressed against said cap floor.

11. The housing cap as claimed in claim 10, wherein:
said window pane and said cap floor are adhesively connected with one another.

12. The housing cap as claimed in claim 5, wherein:
the seal includes a sealing element.

13. The housing cap as claimed in claim 5, wherein:
the seal includes a layer of synthetic material.

14. The housing cap as claimed in claim 1, wherein:
said window pane is metalized on its side facing away from said cap floor, in a region extending over the entire side facing away from said cap floor.

15. The housing cap as claimed in claim 1, wherein:
the cap basic body is pot-shaped.

16. The housing cap as claimed in claim 1, wherein:
the material of the window pane is selected from: glass, glass ceramic or plastics.

17. The housing cap as claimed in claim 1, wherein:
the contact disk is a annular contact disk.

18. The housing cap as claimed in claim 1, wherein:
the groove is an encircling groove.

19. The housing cap as claimed in claim 1, wherein:
the contact region is galvanically connected with said window pane.

20. The housing cap as claimed in claim 1, wherein:
the contact region directly contacts said window pane.

21. A housing cap, comprising:
a cap basic body with a cap floor exhibiting an opening and with a surrounding cap lateral wall adjoining an edge of said cap floor;
a window pane of a translucent material placed on a side of said cap floor facing toward said cap lateral wall in a manner sealing said opening of said cap floor;
and a contact disk placed on a side of said window pane facing away from said cap floor;
wherein:
said cap lateral wall includes a groove on an inner side facing said window pane;
said contact disk exhibits: a contact region bearing against said window pane and an outer edge having formed thereon a plurality of teeth, which are in engagement with said groove;
said cap basic body is a metal cap basic body;
said contact disk is a metal contact disk;

said window pane is metallized on its side facing away from the cap floor, at least in a region contacted by the contact disk;

and said contact region is galvanically connected with said window pane.

22. The housing cap as claimed in claim 21, wherein: said contact disk is at least partially elastically deformed, in the region of its outer edge, relative to an original starting state.

23. The housing cap as claimed in claim 21, wherein: at least some of the teeth of said contact disk are elastically deformed relative to a respective original starting state.

24. The housing cap as claimed in claim 21, wherein: said window pane and said cap floor are adhesively connected with one another.

25. The housing cap as claimed in claim 21, further comprising: a seal located between said window pane and said cap floor.

26. The housing cap as claimed in claim 21, wherein: said contact disk holds said window pane pressed against said cap floor.

27. The housing cap as claimed in claim 26, wherein: said window pane and said cap floor are adhesively connected with one another.

28. The housing cap as claimed in claim 21, wherein: the seal includes a sealing element.

29. The housing cap as claimed in claim 21, wherein: the seal includes a layer of synthetic material.

30. The housing cap as claimed in claim 21, wherein: said window pane is metalized on its side facing away from said cap floor, in a region extending over the entire side facing away from said cap floor.

31. The housing cap as claimed in claim 21, wherein: the cap basic body is pot shaped.

32. The housing cap as claimed in claim 21, wherein: the material of the window pane is selected from: glass, glass ceramic or plastics.

33. The housing cap as claimed in claim 21, wherein: the contact disk is an annular contact disk.

34. The housing cap as claimed in claim 21, wherein: the groove is an encircling groove.

35. An electronics housing, comprising: a housing basic body including a cavity for accommodating an electronics assembly, as well as a housing cap as claimed in claim 21, wherein said housing basic body includes an open end and said housing cap is connected with said housing basic body on the open end thereof.

36. The electronics housing as claimed in claim 35, wherein: said housing basic body includes a side wall surrounding said cavity.

37. The electronics housing as claimed in claim 35, wherein: said cavity of said housing basic body is sealed by means of the housing cap explosion resistant.

38. The electronics housing as claimed in claim 35, wherein: said cavity of said housing basic body is sealed by means of the housing cap tightly against water spray.

* * * * *